(12) United States Patent
Brenot et al.

(10) Patent No.: US 8,948,605 B2
(45) Date of Patent: Feb. 3, 2015

(54) REFLECTIVE SEMICONDUCTOR OPTICAL AMPLIFIER FOR OPTICAL NETWORKS

(75) Inventors: Romain Brenot, Palaiseau (FR); Francis Poingt, Palaiseau (FR)

(73) Assignee: Alcatel Lucent, Boulogne-Billancourt (FR)

( * ) Notice: Subject to any disclaimer, the term of this patent is extended or adjusted under 35 U.S.C. 154(b) by 125 days.

(21) Appl. No.: 13/698,330

(22) PCT Filed: Jun. 16, 2011

(86) PCT No.: PCT/EP2011/060045
§ 371 (c)(1),
(2), (4) Date: Dec. 13, 2012

(87) PCT Pub. No.: WO2012/000804
PCT Pub. Date: Jan. 5, 2012

(65) Prior Publication Data
US 2013/0101297 A1 Apr. 25, 2013

(30) Foreign Application Priority Data
Jun. 30, 2010 (EP) .................................... 10290362

(51) Int. Cl.
*H01S 5/028* (2006.01)
*H04B 10/297* (2013.01)
(Continued)

(52) U.S. Cl.
CPC ............ *H04B 10/2971* (2013.01); *H01S 5/026* (2013.01); *H01S 5/5027* (2013.01);
(Continued)

(58) Field of Classification Search
USPC ....................... 359/341.1; 398/135; 372/49.01
See application file for complete search history.

(56) References Cited

U.S. PATENT DOCUMENTS 4,794,346 A 12/1988 Miller
5,416,866 A 5/1995 Sahlen
(Continued)

FOREIGN PATENT DOCUMENTS

GB 2270174 B 3/1996
JP H05-075093 3/1993
(Continued)

OTHER PUBLICATIONS

Phua, P.B. et al: "Room-Temperature Operation of a Multiwatt Tm:Yag Laser Pumped by A 1-Mum Nd:Yag Laser", Optics Letters; OSA, Optical Society of America; Washington, D.C. US; vol. 25. No. 9. May 1, 2000. pp. 619-621; Xp000937010.
(Continued)

*Primary Examiner* — David Payne
*Assistant Examiner* — Omar S Ismail
(74) *Attorney, Agent, or Firm* — Harness. Dickey & Pierce (57) ABSTRACT

The present document relates to passive optical networks (PON). More particularly but not exclusively, it relates to the use of a reflective semiconductor optical amplifier (RSOA) for amplifying signals in a Gigabit PON (GPON) or WDM-PON. An apparatus configured to amplify light at different wavelengths in an optical network is described. The apparatus comprises a first active material configured to amplify light at a first wavelength and a second active material configured to amplify light at a second wavelength. Furthermore, the apparatus comprises a first reflector which separates the first and second active materials and which is configured to reflect light at the first wavelength and which is configured to be substantially transparent to light at the second wavelength. In addition, the apparatus comprises a second reflector adjacent the second active material opposite to the first reflector which is configured to reflect light at the second wavelength.

15 Claims, 3 Drawing Sheets

(51) Int. Cl.
- *H01S 5/026* (2006.01)
- *H01S 5/50* (2006.01)
- *H04B 10/291* (2013.01)
- *H01S 5/042* (2006.01)
- *H01S 5/10* (2006.01)
- *H01S 3/23* (2006.01)

(52) U.S. Cl.
CPC .............. *H04B10/291* (2013.01); *H01S 5/042* (2013.01); *H01S 5/10* (2013.01); *H01S 3/2333* (2013.01); *H01S 5/028* (2013.01); *H01S 5/1017* (2013.01)
USPC .......... 398/135; 398/79; 359/344; 372/49.01; 372/50.1; 372/50.22

(56) References Cited

U.S. PATENT DOCUMENTS

| | | | |
|---|---|---|---|
| 6,356,693 | B1 | 3/2002 | Shimizu et al. |
| 7,095,772 | B1 | 8/2006 | Delfyett et al. |
| 7,643,758 | B1 | 1/2010 | Sguazzotti et al. |
| 7,920,322 | B2 | 4/2011 | Oh et al. |
| 2002/0109889 | A1 | 8/2002 | Koteles |
| 2004/0218652 | A1 | 11/2004 | Spariosu et al. |
| 2007/0264021 | A1* | 11/2007 | Li et al. .......................... 398/135 |
| 2009/0274187 | A1* | 11/2009 | Kudo et al. ................. 372/49.01 |
| 2010/0092175 | A1* | 4/2010 | Kim et al. ....................... 398/79 |
| 2010/0158427 | A1 | 6/2010 | Choi et al. |

FOREIGN PATENT DOCUMENTS

| | | |
|---|---|---|
| JP | H05-267795 | 10/1993 |
| JP | 2000-040852 | 2/2000 |
| JP | 2000-58953 | 2/2000 |
| JP | 2000-338453 | 8/2000 |
| JP | 2001-156364 | 6/2001 |
| JP | 2002-148733 | 5/2002 |
| JP | 2002-280649 | 9/2002 |
| JP | 2003-124578 | 4/2003 |
| JP | 2009-124046 | 6/2009 |
| KR | 10-2008-0052093 | 6/2008 |

OTHER PUBLICATIONS

Raybon, G. et al: "A Wavelength-Tunable Semiconductor Amplifier/Filter for Add/Drop Multiplexing in WDM Networks", IEEE Photonics Technology Letters, IEEE Service Center, Piscataway, NJ, US; vol. 9. No. 1. Jan. 1, 1997; XP011048529.
International Search Report PCT/ISA/210.

* cited by examiner

FIG_1

FIG_2

FIG_3

FIG_4

REFLECTIVE SEMICONDUCTOR OPTICAL AMPLIFIER FOR OPTICAL NETWORKS

CROSS REFERENCE

This application claims the benefit of European patent application No. 10290362.2, filed Jun. 30, 2010 and claims the benefit of PCT patent application No. PCT/EP2011/060045, filed Jun. 16, 2011, the respective contents of which are hereby incorporated by reference in their entirety.

FIELD OF INVENTION

The present document relates to passive optical networks (PON). More particularly but not exclusively, it relates to the use of a reflective semiconductor optical amplifier (RSOA) for amplifying signals in a Gigabit PON (GPON) or WDM-PON.

BACKGROUND

Some early work on efficient "fiber to the home" architectures was done in the 1990s by the Full Service Access Network (FSAN) working group, formed by major telecommunications service providers and system vendors. The International Telecommunications Union (ITU) did further work, and has since standardized two generations of passive optical networks. PON is a point-to-multipoint, "fiber to the premises" network architecture in which unpowered passive optical splitters may be used to enable a single optical fiber to serve multiple premises, typically 32 up to 128. A PON typically comprises an Optical Line Termination (OLT) at the service provider's central office and a number of Optical Network Units (ONUs) or Optical Network Terminals (ONT) near end users. A PON configuration typically reduces the amount of fiber and central office equipment required compared with point-to-point (PTP) architectures.

Downstream signals in PON are typically broadcast to each premise sharing a single feeder fiber. Upstream signals are typically combined using a Multiple Access Control (MAC) protocol based on Time Division Multiple Access (TDMA). The OLTs typically configure the served ONTs in order to provide time slot assignments for upstream communication.

Different variants of PON architectures have been specified. APON (ATM Passive Optical Network) was used primarily for business applications, and was based on ATM. BPON (Broadband PON) is a standard based on APON. It adds support for additional RF video services provided on a separate optical channel via WDM, dynamic and higher upstream bandwidth allocation, and survivability. It also creates a standard management interface, called OMCI, between the OLT and ONU/ONT, enabling mixed-vendor networks. GPON, which is an evolution of the BPON standard, supports higher rates, enhanced security, and the choice of the Layer 2 protocol (ATM, TDM and Ethernet via GEM). In addition, the IEEE issued an Ethernet PON (EPON or GEPON) standard in 2004, as part of the Ethernet First Mile project. EPON typically uses standard Ethernet frames with symmetric 1 gigabit per second upstream and downstream rates.

The ITU-T G.984 GPON standard represents a boost in both the total bandwidth and bandwidth efficiency through the use of large, variable-length packets. The standard permits several choices of bit rate, but the industry has converged on 2,488 megabits per second (Mbit/s) of downstream bandwidth, and 1,244 Mbit/s of upstream bandwidth. To allow such bandwidth over a distance of 20 km when using a 64-way optical splitter, a demanding optical budget of 28 dB is required.

GPON takes advantage of Wavelength Division Multiplexing (WDM), using one wavelength for downstream traffic and another for upstream traffic on a single standard single-mode fiber (ITU-T G.652). The specification calls for downstream traffic to be transmitted on the 1490 (±10) nanometer (nm) wavelength and upstream traffic to be transmitted at 1310 (±50) nm wavelength. The 1550 nm band is allocated for optional overlay services, typically RF video (in the range 1550-1560 nm). Furthermore, GPON is a shared network, in that the OLT sends a single stream of downstream traffic that is received by all ONTs. Each ONT typically only reads the content of those packets that are addressed to it. Encryption is typically used to prevent eavesdropping on downstream traffic.

In the following and in the claims, a wavelength of about 1310 nm is referred to by the rounded value of 1.3 µm and a wavelength of about 1490 nm wavelength is referred to by the rounded value of 1.5 µm for the sake of simplicity.

The present document relates to extending the reach of PON or WDM-PON systems using two or more different optical wavelengths for the downstream and the upstream direction. In more general terms, the present document relates to providing an extension of the optical budget in optical access networks. This budget extension should be achieved in a cost-effective manner. Furthermore, the budget extension should be transparent to the underlying optical signals.

SUMMARY

Accordingly, it is desirable to provide an efficient apparatus and method for amplification of light at different wavelengths in WDM systems. In particular, it is desirable to provide an efficient amplification of the optical upstream and downstream signals in a PON system such as GPON, 10GPON and/or WDM-PON.

According to some embodiments, there is provided an apparatus which is configured to amplify light at different wavelengths in an optical communication network, e.g. a GPON, WDM-PON or WDM network. The apparatus may comprise a first active material configured to amplify light at a first wavelength. Furthermore, the apparatus may comprise a second active material configured to amplify light at a second wavelength. The light within the apparatus may be confined within or carried by an optical waveguide which comprises a first region comprising the first active material and a second region comprising the second active material. The optical waveguide may comprise a first end and a second end. Typically, the light may enter the waveguide at the first end which, relative to the direction of propagation of the entering light, is upstream of the first region. The second end of the waveguide is opposite to the first end.

While the second active material may amplify light at the second wavelength, it may absorb light which has a wavelength that is smaller than the second wavelength, e.g. light at the first wavelength. In view of this, the apparatus may further comprise a first reflector which separates the first and second active materials and which is configured to reflect light at the first wavelength. Furthermore, the first reflector may be configured to be substantially transparent to light at the second wavelength so that light at the second wavelength may be amplified in the second active material.

As such, the light at different wavelengths, e.g. the optical upstream and downstream signal of a GPON, may enter the waveguide of the apparatus at a first end. The light at the first and second wavelength may be carried through the first region of the waveguide comprising the first active material. At the opposite end of the first region, the light at the first wavelength may be reflected using a first reflector, while the light at the second wavelengths may pass through the reflector to enter the second region of the waveguide comprising the second active material.

The apparatus may further comprise a second reflector which is provided adjacent the second active material and opposite to the first reflector and which is configured to reflect the light at the second wavelength. Consequently, the light at the second wavelength may be reflected at the opposite end of the second region and carried back to the first end of the waveguide via the second region, the first reflector, and the first region. The second reflector may be provided at a second end of the waveguide, opposite to the first end.

The apparatus may be implemented as a semiconductor optical amplifier comprising active materials which may be semiconducting materials. The first active material and/or the second active material may comprise Gallium, Indium, Arsenide and/or Phosphide.

The second reflector may be provided by the second end of the waveguide of the apparatus. As such, the abrupt end of the waveguide and the abrupt change in refractive index may lead to a reflection of light at specific wavelengths, e.g. light at the second wavelength. Alternatively or in addition, the second reflector may be implemented by coating the second end of the waveguide with one or more layers of reflective material, e.g. a metal such as Silver or Aluminum.

The first reflector may comprise an air gap between the first and second active material. In this case, it is the change in the refractive index between the first active material and the air, as well as the change in the refractive index between the air and the second active material, which provides for a high reflectivity with regards to light at a specific wavelength, e.g. light at the first wavelength, and which provides for a high transparency with regards to light at another wavelength, e.g. light at the second wavelength.

The reflection and transparency properties of the first reflector with regards to light at different wavelengths may be tuned by adjusting the width of the air gap. In an embodiment, the air gap between the first and second active material may have a width of about 0.8 μm which provides for a high reflectivity with regards to a wavelength of about 1.3 μm and a high transparency with regards to a wavelength of about 1.5 μm.

The first reflector may be provided in the form of a Bragg reflector between the first and second active material. This is advantageous as it allows for a reflector with high reflectivity over a narrow wavelength interval and high transparency over another different wavelength interval.

The first reflector may also be provided by the change in the refractive index which occurs as light propagates from the first active material to the second active material. In this case both active materials may abut on one another.

The light at the first wavelength may enter the first active material in a direction of propagation which points towards the first reflector and which is substantially perpendicular to the first reflector. Consequently, the direction of propagation of light which travels towards the first reflector and the direction of propagation of reflected light which travels away from the first reflector is substantially parallel. Typically, the light is carried by the waveguide of the apparatus, wherein the waveguide extends in a direction perpendicular to the first reflector.

In a similar manner, the light at the second wavelength may enter the second active material in a direction of propagation which points towards the second reflector and which is perpendicular to the second reflector so that the light of the second wavelength can be reflected back directly into the waveguide. Typically, the first and second reflector are substantially parallel so that when the light at the first and second wavelengths is substantially parallel, the direction of propagation of the light at the first wavelength and the direction of propagation of light at the second wavelength are substantially parallel before and after being reflected by the first and second reflector, respectively. Typically, this is achieved by providing a waveguide for carrying the light at different wavelengths, wherein the waveguide extends within the apparatus in a direction perpendicular to the first and second reflector.

In order to amplify the light at the first and second wavelengths, the apparatus may further comprise means for electrically pumping the first and second active material.

It should be noted that the apparatus may be used to amplify light at a plurality of wavelengths, i.e. light at two or more different wavelengths. In particular, the apparatus may be used to amplify light of WDM communication systems using two or more different optical wavelengths. In such a case, the apparatus may be provided with additional active materials and reflectors. If, for example, three different wavelengths are used, the apparatus may further comprise a third active material configured to amplify light at a third wavelength and a third reflector adjacent the third active material opposite to the second reflector which is configured to reflect tight at the third wavelength. Furthermore, the second reflector may separate the second and the third active materials and may be configured to reflect light at the second wavelength and configured to be substantially transparent to light at the third wavelength. In addition, the first reflector may be configured to be substantially transparent to light at the third wavelength.

In generic terms, an apparatus for amplifying light at a plurality of wavelengths is described. The apparatus comprises a waveguide to carry the light at a plurality of wavelengths. The light enters the waveguide of the apparatus at a first end of the waveguide. The waveguide comprises a plurality of regions which comprise a plurality of different active materials, respectively. The different regions may be separated by a plurality of reflectors. Each active material may be configured to amplify light at a particular wavelength of the plurality of wavelengths. Preferably, the regions comprising the active materials are arranged such that for each pair of adjacent regions, the active material of the region which is closer to the first end of the waveguide amplifies light at a lower wavelength, compared to the active material of the region which is further away from the first end of the waveguide.

A reflector between two adjacent regions is typically configured to reflect light at the wavelength of the material amplified within the region which is closer to the first end. Furthermore, the reflector is typically configured to be transparent to light at the wavelengths of the plurality of wavelengths which are greater than the wavelength of the reflected light.

According to some embodiments, there is provided an optical network comprising a first transmitter/receiver means, a second transmitter/receiver means and amplification means according to any of the above described embodiments. The first and second transmitter/receiver means may e.g. be an ONU or an OLT in a GPON or WDM-PON network. Alternatively or in addition, the first and second transmitter/receiver means may be a WDM transmitter and/or receiver or a WDM transmission network. The amplification means may be a semiconductor optical amplifier as described in the present document. The first transmitter/receiver means may be connected to the second transmitter/receiver means via the amplification means, thereby extending the optical budget of the optical communication network.

According to some embodiments, there is provided a method for amplifying light at different wavelengths in an optical network. The method may be based on guiding light at a first and a second wavelength, e.g. within a waveguide, into a first active material wherein the light enters the first active material at a first end of the first active material. The light at the first wavelength may then be amplified using the first active material and reflected back into the waveguide at another end of the first active material opposite of the first end of the first active material. By guiding the light at the second wavelength through the first active material into the second active material, the light may enter the second active material at a first end of the second active material. In the second active material the light at the second wavelength may be amplified and reflected back into the waveguide by a reflector which is provided at another end of the second active material opposite of the first end of the second active material.

The embodiments outlined in the present document provide for an efficient, wavelength and bit-rate transparent extension of the optical budget of an optical communication network. In a specific embodiment, a reflective SOA (RSOA) is described which simultaneously amplifies the upstream signal at 1.3 μm and the downstream signal at 1.5 μm of a WDM-PON system.

It should be noted that although preferred embodiments of the invention are described with reference to GPON, the subject matter of the claims is not restricted thereto, but can be practiced in any situation where signal amplification of at least two optical signals at different wavelengths is required.

It is furthermore important to note that the above mentioned embodiments may be combined with one another or extracted from one another in various ways. In particular, all possible claim and feature combinations are considered to be disclosed by the present document. Furthermore, the aspects and features outlined in relation with a system are equally applicable in relation to the corresponding method.

BRIEF DESCRIPTION OF THE FIGURES

The objects and features of the disclosure will become apparent from the following description of examples. The present disclosure is described in the following by referring to exemplary embodiments illustrated schematically in the accompanying figures, wherein FIG. 1 schematically illustrates example signal amplification in an optical network using semiconductor optical amplifiers (SOA);

FIG. 2 schematically illustrates an example apparatus for amplifying light of different wavelengths;

DESCRIPTION OF EMBODIMENTS

In order to extend the reach and to increase the splitting ratio in optical access networks, there is a growing demand for extension boxes which increase the optical budget of upstream and downstream signals. As indicated above, the downstream signals are emitted at about 1.49 μm in today's GPON access networks. Standardization of the next generation of 10 Gbit/s access networks is ongoing, and downstream signals will most likely be located in the wavelength interval of about [1.57 μm, 1.6 μm]. Upstream signals will very likely be emitted in the wavelength interval of about [1.26 μm, 1.3 μm].

Even though the present document relates to the simultaneous amplification of 1.3 μm and 1.5 μm optical signals in order to extend the reach of access networks, it should be noted that the teachings of the document are applicable to next generation of access networks, such as 10GPON based on TDM and/or WDM-PON.

In order to perform budget extension in a PON network, Optical-Electronic-Optical (OEO) regeneration may be used. The fundamental principle of OEO regeneration is to convert an optical signal into electronic format. Subsequently, the timing and shape of the transmitted signal are restored in the electrical domain. Eventually, the regenerated electrical signal is used to modulate an optical emitter in order to generate a regenerated optical signal. Budget extension based on OEO regeneration requires at least a photodiode, a stage of electronic regeneration and an optical emitter for each wavelength. Furthermore, OEO regeneration is typically designed for a specific bit-rate. Accordingly, OEO regeneration is inefficient in that it requires at least 3 components per wavelength and it is not transparent to the wavelength and the bit-rate of the transmitted optical signal.

Alternatively, budget extension in a PON with a fixed set of wavelengths may be performed by semiconductor optical amplifiers (SOA). For signal amplification, each SOA uses a semiconductor which acts as an electrically pumped gain medium. As stated above, GPON transmits an upstream and a downstream signal using different wavelengths. Thus, two SOAs are required for amplifying the upstream and the downstream signal transmitted in GPON. In generic terms, typically a separate SOA is required for each wavelength of the optical WDM system. FIG. 1 illustrates a schematic view of an example signal amplifier using two SOAs for the amplification of upstream and downstream data signals in GPON.

In the arrangement according to FIG. 1, an ONU 11 is connected to an OLT 12 over a first multiplexer/demultiplexer 13, a bi-directional SOA 15 and a second multiplexer/demultiplexer 14. The optical signals between the ONU 11 to the OLT 12 are split/merged by the multiplexers/demultiplexers 13, 14 into the different wavelengths of the WDM system, i.e. 1.3 μm and 1.5 μm in the illustrated example. In particular, the upstream signal at 1.3 μm is de-multiplexed from the fiber 16 coming from ONU 11 using the demultiplexer 13. After passing through the bi-directional SOA 15 the upstream signal is multiplexed onto the fiber 17 to the OLT 12 using the multiplexer 14. In the opposite direction, de-multiplexer 14 extracts the optical downstream signal at 1.5 μm from fiber 17, which after passing through the bi-directional SOA 15 is multiplexed onto the fiber 16 to the ONU 11. At the bi-directional SOA 15, each optical signal corresponding to a specific wavelength is amplified by a specific corresponding SOA, i.e. the 1.3 μm upstream signal is amplified by a first SOA and the 1.5 μm downstream signal is amplified by a second SOA.

In other words, the amplifier arrangement of FIG. 1 may be used to amplify both wavelengths in a GPON system, regardless the bit-rate of the signals carried over the different wavelengths. However, the use of a bi-directional SOA 15 is inefficient since it requires a perfect alignment of four fibers, two multiplexer/demultiplexer units 13, 14 and two SOAs. The use of two separate SOAs for each wavelength within the bi-directional SOA 15 is typically required because both wavelengths, i.e. 1.3 μm and 1.5 μm, are too far apart to be amplified by the same active material of an SOA. Such active material is typically limited to amplifying optical signals within a wavelength window of 50 nm to 80 nm only. If the wavelengths of the upstream and downstream signal, i.e. 1.3 µm and 1.5 µm, are to be amplified in a joint amplifier, a conventional semiconductor optical amplifier cannot be used.

FIG. 2 schematically illustrates an apparatus 21 for amplifying light of different wavelengths, i.e. notably for amplifying light at wavelengths which cover an interval of more than 80 nm. In other words, the apparatus 21 may be used for amplifying optical signals at different optical wavelengths, wherein the different optical wavelengths lie within different wavelength intervals or windows. The apparatus 21 comprises a waveguide 20 which comprises different regions 22, 23. In particular, the waveguide 20 may comprise a first active material 22' within a first region 22 and a second active material 23' within a second region 23. The first 22 and second 23 regions may be separated by a first reflector 24.

The first reflector 24 may reflect the light of a first signal 25 at a wavelength lying within a first wavelength interval. The first reflector 24 may be configured to reflect light from the first wavelength interval. In a preferred embodiment, the first signal 25 has a wavelength of 1.3 µm lying within the first wavelength interval, e.g. [1.26 µm, 1.34 µm]. The first signal 25 may be the upstream signal in a GPON system.

A high percentage, e.g. a percentage of more than 50%, of light of a second signal 26 having a wavelength which lies within a second wavelength interval may pass through the first reflector 24. The second wavelength interval is different from the first wavelength interval. In particular, the second wavelength interval may comprise wavelengths which are larger than the wavelengths of the first wavelength interval. In a preferred embodiment, all wavelengths of the second wavelength interval pass through the first reflector 24. The second wavelength may be 1.5 µm and the second wavelength interval may be e.g. [1.46 µm, 1.54 µm]. As such, the second signal 26 may be the downstream signal of a GPON system.

The light of the second wavelength interval and/or the wavelength of the second signal 26 may be reflected by a second reflector 27 which is adjacent the second active material 23, opposite to the first reflector 24.

The light of the first and second signals 25, 26 may enter the apparatus 21, i.e. the waveguide 20 of the apparatus 21, in a direction towards the first reflector 24, in particular in a direction perpendicular to the plane of the first reflector 24. The first reflector 24 and the second reflector 27 may have parallel reflection surfaces.

As such, the apparatus 21 may be used to separate a first signal 25 from a second signal 26 using a selective reflector 24, wherein the first 25 and second signal 26 have different optical wavelengths within different wavelength intervals. Due to the selective reflector 24, only the second signal 26 enters the second region 23 comprising the second active material 23'. The second active material 23' may be selected to amplify light in the second wavelength interval, i.e. to amplify the second signal 26.

On the other hand, the first 25 and second 26 signals overlap in the first region 22. The first active material 22' may be selected to amplify light in the first wavelength interval, while leaving light in the second wavelength interval unaffected. In other words, the first active material 22' may be selected to amplify the first signal 25, while leaving unaffected the second signal 26.

This may be achieved by selecting appropriate opto-electrical materials for the first 22 and second 23 region. Such opto-electrical materials may be designed to amplify light within a pre-determined wavelength interval. Furthermore, the material may be designed such that light at wavelengths below the pre-determined wavelength interval is absorbed, while light at a wavelength above the pre-determined wavelength interval passes through the opto-electrical material unaffected.

In a preferred embodiment, the first and second active materials 22', 23' may comprise Indium (In), Gallium (Ga), Arsenide (As) and/or Phosphide (P). The first active material 22' may be In x Ga (1-x) As y P (1-y) with x~0.71 and y~0.62, in order to amplify light at the first wavelength interval and in particular the wavelength of the first signal 25 (e.g. 1.3 µm). The second active material 23' may be In x Ga (1-x) As y P (1-y) with x~0.58 and y~0.9, in order to amplify light at the second wavelength interval and in particular the wavelength of the second signal 26 (e.g. 1.3 µm). It should be clear to the skilled person that these values are to be interpreted as approximations, as the exact compositions will typically depend on the strain in the epitaxial layers (in order to optimize the sensitivity to incoming light polarization).

The reflectors 24, 27 may be implemented by various optical reflection means. In particular, the first reflector 24, i.e. a reflector between two active materials 22', 23', may be provided by an air gap of a particular width or a Bragg reflector. The width (in signal direction) of the air gap and/or the design of the layers of the Bragg reflector are selected such that the first signal 25 is reflected, whereas the second signal 26 is allowed to pass. The second reflector 27, i.e. the last reflector of the apparatus 21, may e.g. be provided by the end of a waveguide, i.e. by the abrupt edge of the waveguide. This end or edge may be further provided with at least one reflective layer. The at least one reflective layer may comprise layers of Si/SiO$_2$ or TiO2/SiO2 or metals such as Silver or Aluminum.

It should be noted that while the apparatus 21 of FIG. 2 is illustrated for the amplification of two wavelengths, the underlying principle of apparatus 21 may be extended to an arbitrary number of wavelengths, e.g. the wavelengths of a WDM system. In general terms, the waveguide 20 may carry a plurality of signals at different wavelengths $\lambda_i$, i=1, N (N being an arbitrary integer value greater than one), wherein each wavelength $\lambda_i$ belongs to a different wavelength interval $T_i$, i=1, ..., N. Without loss of generality, it is assumed that the different wavelength intervals $T_i$ are ordered according to increasing wavelengths, i.e. $T_N$ comprises the highest wavelengths and $T_1$ comprises the lowest wavelengths.

In order to amplify the different wavelengths $\lambda_i$, apparatus 21 may comprise a succession of regions comprising different active materials $M_i$, i=1, ..., N. The different regions and materials are separated by different reflectors $R_i$, i=1, ..., N. Each reflector $R_i$ is configured to reflect wavelengths $\lambda_i$ from the wavelengths interval $T_i$. Furthermore, each reflector $R_i$ is configured to let pass wavelengths $\lambda_j$ from the wavelengths interval $T_j$, for j>i. Each active material $M_i$ is configured to amplify light at a wavelength $\lambda_i$ belonging to the wavelength interval $T_i$. Furthermore, each active material $M_i$ is configured to leave unaffected light at a wavelength $\lambda_j$ belonging to the wavelength interval $T_j$, for j>i.

In an embodiment, the above conditions may be achieved by selecting appropriate compositions of opto-electrical materials $M_i$ such as semiconductor materials comprising Indium (In), Gallium (Ga), Arsenide (As) and/or Phosphide (P). The different reflectors R, may be implemented by designing appropriate Bragg refractors and/or air gap reflectors.

Figure 3:
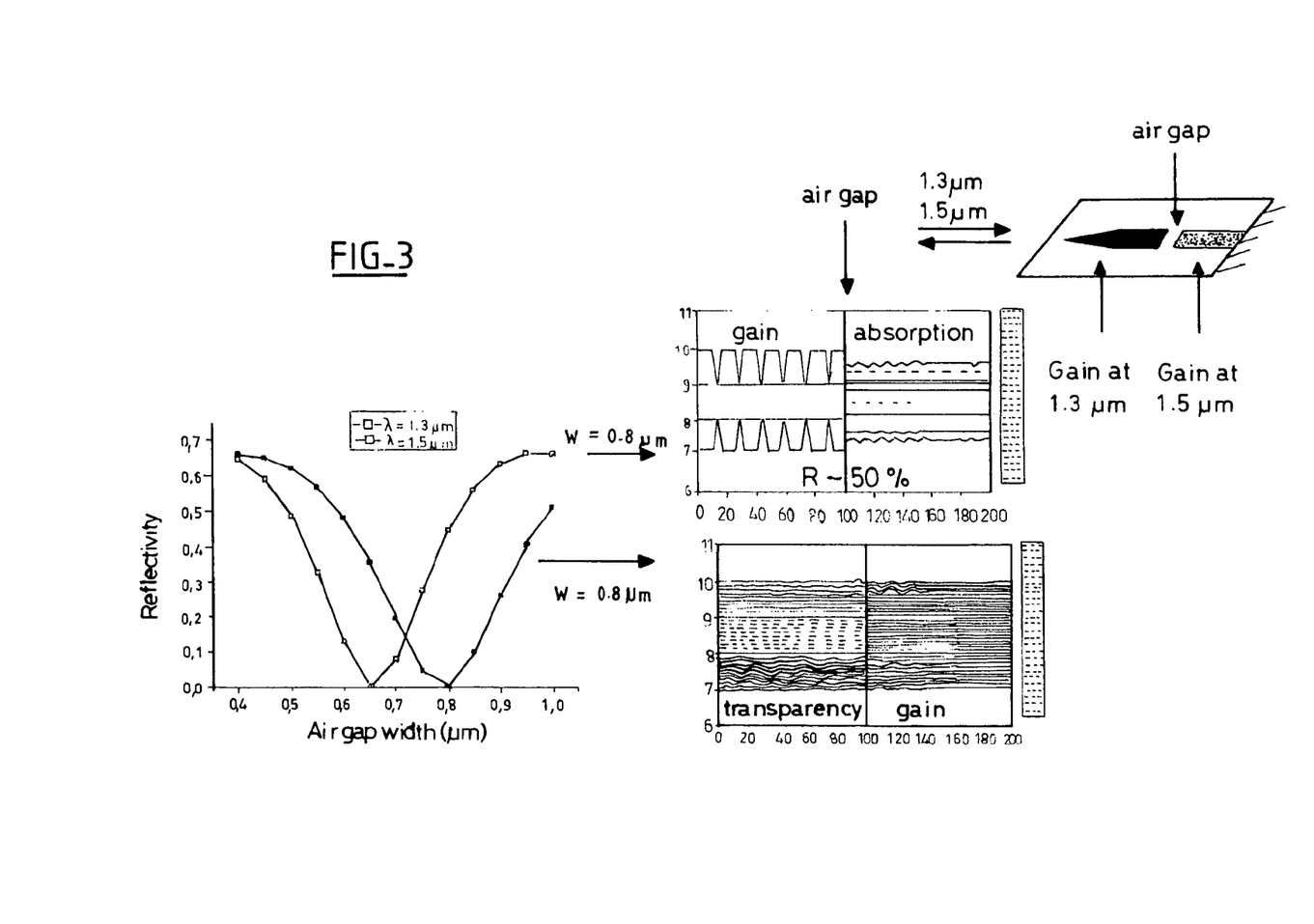
FIG. 3 schematically illustrates example gain and absorption values in the example apparatus of FIG. 2.

FIG. 3 illustrates the gain and absorption incurred by signals at two different wavelengths within apparatus 21. The gain/absorption table 31 illustrates that the first signal 25 having a wavelength within the first wavelength interval, e.g.

the 1.3 μm signal, may be amplified when passing through the first active material 22' and may be absorbed when passing through the second active material 23'. Furthermore, gain/absorption table 32 shows that the second signal 26 having a wavelength within the second wavelength interval, e.g. the 1.5 μm signal, passes through the first active material 22' without being absorbed and is only lightly reflected by reflector 24. As can be seen from gain/absorption tables 31, 32 only the second signal 26 enters the second region 23, so that the second active material 23' may be selected to amplify the second signal 26.

As shown in the reflectivity diagram 33 of FIG. 3, an air gap having a width of about 0.8 μm leads to a low reflectivity at a wavelength of 1.5 μm, together with a significant reflectivity at a wavelength of 1.3 μm. Therefore, the reflector 24 of apparatus 21 may comprise an air gap between the first active material 22' and the second active material 23', the air gap having a width (in the direction of propagation of the signal) of about 0.75 to about 0.85 μm. In a preferred embodiment, the air gap may have a width of about 0.8 μm. As can be seen from the reflectivity diagram 33, the width of the air gap may be adjusted, in order to adjust the reflectivity/transparency of the wavelength selective selector 24 to the specific signal wavelengths.

Figure 4:
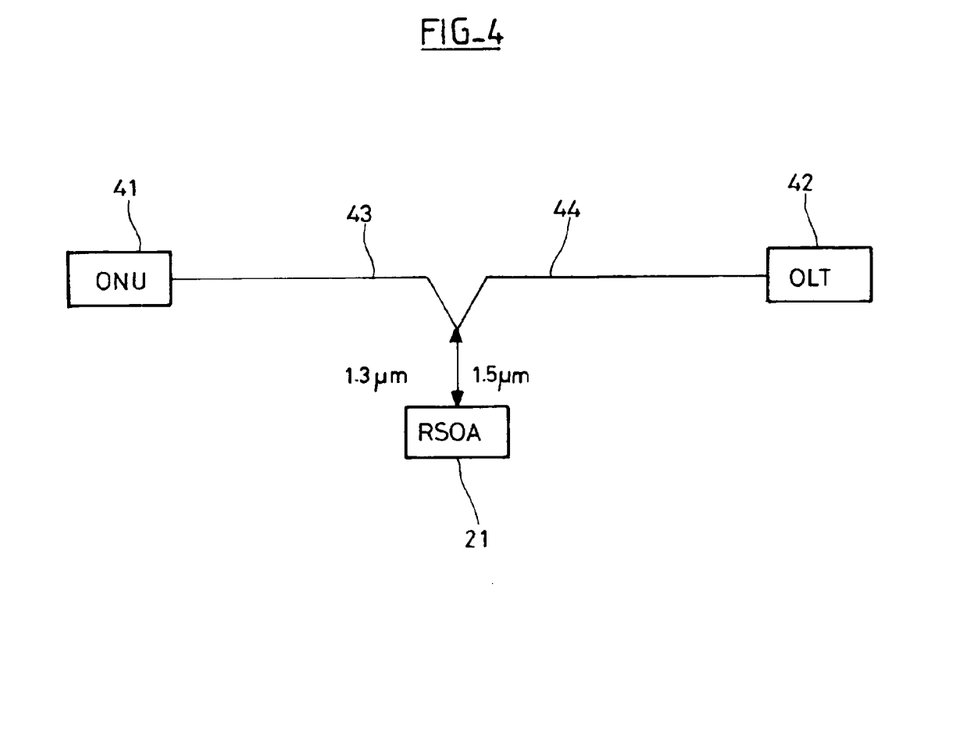
FIG. 4 schematically illustrates an example optical network with signal amplification means, e.g. the apparatus FIG. 2.

FIG. 4 illustrates a schematic view of an optical network comprising a first transmitter/receiver 41, e.g. an ONU, a second transmitter/receiver 42, e.g. an OLT, and signal amplification means 21, e.g. apparatus 21 shown in FIG. 2, i.e. a reflective semiconductor optical amplifier (RSOA).

ONU 41 may be connected to RSOA 21 by first data transmission means 43. Said first data transmission means may be operable to transmit one or more signals, e.g. light of specific wavelengths. In a preferred embodiment, the specific wavelengths may be in the 100 THz region, i.e. the near-infrared or visible region of the electromagnetic spectrum. Accordingly, the data transmission means may be an optical connector such as an optical fiber. RSOA 21 may be connected to OLT 42 by second data transmission means 44 which may have the same properties as first data transmission means 43. In a preferred embodiment the optical network according to FIG. 4 may be a PON, e.g. a WDM-PON and/or GPON.

RSOA 21 may be the signal amplification means described with reference to FIG. 2. For this purpose the first and second data transmission means 43, 44 are connected to the waveguide 20 of the RSOA 21. This connection may be performed by butt coupling of the data transmission means 43, 44, e.g. fibers, and the waveguide 20 of RSOA 21.

In the present document, a wavelength selective amplifier for optical signals has been described. In particular, a wavelength selective reflective semiconductor optical amplifier for GPON systems has been described. The amplifier may be directly connected to an optical fiber carrying a plurality of wavelengths. As such, the need for separate multiplexer/de-multiplexer units 13, 14 is removed. Furthermore, the amplification of the different optical wavelengths may be performed in a single semiconductor optical amplifier, thereby removing the need for separates SOAs for the different wavelengths and the need for aligning an increased number of optical fibers. Overall, an efficient and cost-effective solution has been described for amplifying a plurality of optical wavelength within a single semiconductor optical amplifier. The optical amplifier may be applied to GPON, 10GPON, WDM-PON access networks or WDM transmission networks.

It should be noted that the description and drawings merely illustrate the principles of the proposed methods and systems. It will thus be appreciated that those skilled in the art will be able to devise various arrangements that, although not explicitly described or shown herein, embody the principles of the invention and are included within its spirit and scope as claimed herein. Furthermore, all examples recited herein are principally intended expressly to be only for pedagogical purposes to aid the reader in understanding the principles of the proposed methods and systems and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass equivalents thereof.

The invention claimed is:

1. An apparatus configured to amplify light at different wavelengths in an optical network, the apparatus having a waveguide, the waveguide comprising:
   a first active material configured to amplify light at a first wavelength received at a first end of the waveguide;
   a second active material configured to amplify light at a second wavelength;
   a first reflector located between the first and second active materials and which is configured to reflect light at the first wavelength in a direction toward the first end and which is configured to be substantially transparent to light at the second wavelength; and
   a second reflector adjacent the second active material which is configured to reflect light at the second wavelength in a direction toward the first end,
   wherein the first reflector includes at least one of an air gap and a Bragg reflector between the first and the second active materials.

2. The apparatus of claim 1, wherein the first active material and/or the second active material comprise Gallium, Indium, Arsenide and/or Phosphide.

3. The apparatus of claim 1, wherein
   the apparatus comprises a waveguide carrying the light at different wavelengths; and
   the second reflector is provided at the end of the waveguide of the apparatus.

4. The apparatus of claim 1, wherein the first reflector comprises the air gap between the first and second active material.

5. The apparatus of claim 4, wherein
   the air gap between the first and second active material has a width of about 0.8 μm;
   the first wavelength is about 1.3 μm; and
   the second wavelength is about 1.5 μm.

6. The apparatus of claim 1, wherein the first reflector comprises a Bragg reflector between the first and second active material.

7. The apparatus of claim 1, wherein the light at the first wavelength enters the first active material in a direction of propagation which points towards the first reflector and which is perpendicular to a plane of the first reflector.

8. The apparatus of claim 7, wherein the light at the second wavelength enters the second active material in a direction of propagation which points towards the second reflector and which is perpendicular to a plane of the second reflector.

9. The apparatus of claim 8, wherein the directions of propagation of the light at the first wavelength and the light at the second wavelength are substantially parallel.

10. The apparatus of claim 1, wherein the apparatus further comprises means for electrically pumping the first and second active material.

11. The apparatus of claim 1, wherein the apparatus further comprises:
a third active material configured to amplify light at a third wavelength; and
a third reflector adjacent the third active material which is configured to reflect light at the third wavelength;
wherein the second reflector is located between the second and the third active materials, and wherein the first and second reflector are configured to be substantially transparent to light at the third wavelength.

12. The apparatus of claim 1, wherein the first reflector is provided by a change in the refractive index which occurs as light propagates from the first active material to the second active material.

13. The apparatus of claim 1, wherein the first wavelength is smaller than the second wavelength.

14. An optical network comprising:
first transmitter/receiver means;
second transmitter/receiver means; and
amplification means according to any of claims 1 to 13;
wherein the first transmitter/receiver means is connected to the second transmitter/receiver means via the amplification means.

15. A method for amplifying light at different wavelengths in an optical network, the method comprising:
guiding light at a first and a second wavelength into a first active material;
wherein the light enters the first active material at a first end of the first active material;
amplifying the light at the first wavelength using the first active material;
reflecting the light at the first wavelength at another end of the first active material in a direction toward the first end of the first active material, the reflecting of the light being caused by at least one of an air gap and a Bragg reflector that exists between the first and the second active materials;
guiding the light at the second wavelength through the first active material into the second active material;
wherein the light enters the second active material at a first end of the second active material;
amplifying the light at the second wavelength using the second active material; and
reflecting the light at the second wavelength at another end of the second active material in a direction toward the first end of the first active material.

* * * * *